United States Patent [19]

Yoneda et al.

[11] 4,267,258

[45] May 12, 1981

[54] NEGATIVE TYPE DEEP ULTRAVIOLET RESIST

[75] Inventors: Yasuhiro Yoneda, Yokohama; Kenro Kitamura, Fujisawa; Jiro Naito, Yamanishi; Toshisuke Kitakohji, Machida, all of Japan

[73] Assignee: Fujitsu Limited, Tokyo, Japan

[21] Appl. No.: 101,688

[22] Filed: Dec. 10, 1979

[30] Foreign Application Priority Data

Dec. 15, 1978 [JP] Japan ............................ 53-156136

[51] Int. Cl.³ .............................................. G03C 1/68
[52] U.S. Cl. ................................ 430/270; 204/159.14; 204/159.22; 430/286; 430/288; 430/302; 430/306; 526/323
[58] Field of Search ............... 430/270, 286, 288, 302, 430/306, 322; 204/159.14, 159.2, 159.22; 526/323

[56] References Cited

U.S. PATENT DOCUMENTS

| | | |
|---|---|---|
| 3,087,915 | 4/1963 | Heiberger et al. .................. 525/306 |
| 3,113,123 | 12/1963 | Heiberger et al. .................. 525/306 |
| 3,475,176 | 10/1969 | Rauner ................................. 430/288 |

Primary Examiner—Jack P. Brammer
Attorney, Agent, or Firm—Staas & Halsey

[57] ABSTRACT

A negative type resist is provided for deep ultraviolet light lithography. This resist comprises a polymer of a diallyl ester of a dicarboxylic acid having a degree of dispersion of 3 or less, which is given by the ratio of a weight-average molecular weight $\overline{M}w$ to a number-average molecular weight Mn. This deep UV resist can produce a fine detail resist pattern having a high resolution, and it has a high sensitivity to irradiating the coated film of the polymer on a substrate with deep UV light followed by development.

12 Claims, 5 Drawing Figures

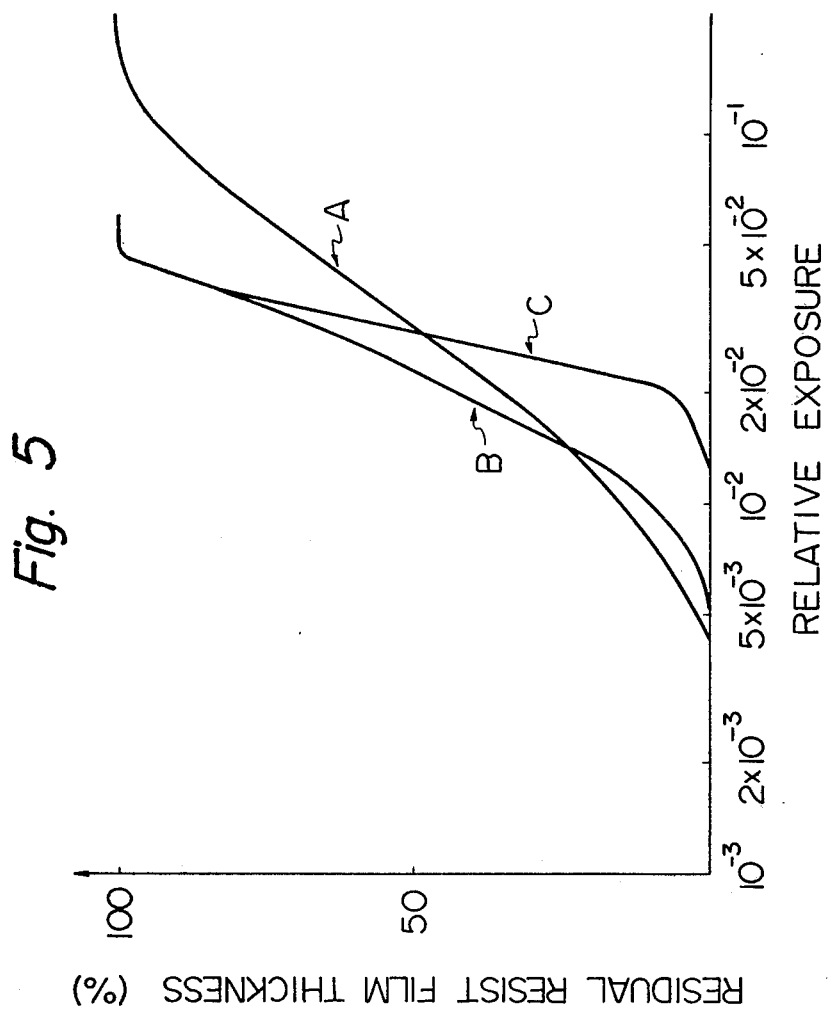

NEGATIVE TYPE DEEP ULTRAVIOLET RESIST

BACKGROUND OF THE INVENTION

1. Field of the Invention

The present invention relates to a negative type resist which has a good sensitivity with respect to deep ultraviolet (UV) light having a wavelength of from 180 to 350 nm and, also, relates to a method for producing a negative type resist pattern on a substrate by using this resist.

2. Description of the Prior Art

It is known that photolithography employing ultraviolet light having a wavelength of from 350 nm to 450 nm is heretofore used as a method for forming a circuit pattern of, for example, a semiconductor integrated circuit. As the formation of highly dense element patterns on substrates is required in the art, fine detail patterns having a limiting width of less than 2 or 3 microns have been desired. As a result, lithography using an electron beam or an X-ray beam was proposed in order to fulfill the needs of microfabrication.

However, lithography using an electron beam or an X-ray beam has drawbacks in that the circuit and the mechanism for deflecting the electron or X-ray beam are complicated.

The use of deep UV light having a wavelength of from 180 to 350 nm, in lieu of UV light, in lithography was proposed in 1975 by Burn Jeng Lin (See: J. Vac. Sci. Technol., Vol 12, No. 6, November/December 1975, pages 1317–1320). He reported that a fine detail pattern of 1 micron or less was able to be easily obtained by using optical structures used in conventional photolithography.

As negative type photoresists used in the deep UV lithography, an allylated or allyl substituted copoly (maleic anhydride-fluoroalkylvinyl ether), 2,3-dibromopropyl acrylate and the like have been proposed. However, these negative type photoresists have drawbacks in that (1) the resolving power thereof is poor, (2) the correct exposure thereof is largely affected by an irradiation atmosphere and (3) the storage stability thereof is poor.

SUMMARY OF THE INVENTION

Accordingly, the objects of the present invention are to obviate the aforementioned drawbacks of the conventional negative type photoresists used in the deep UV lithography, and to provide a negative type resist suitable for use in deep UV lithography having a high resolving power, a correct exposure of which is not affected by an irradiation atmosphere, and having a good storage stability.

Another object of the present invention is to provide a method for producing a fine detail negative type pattern, on a substrate, using a negative type resist for deep UV lithography having a high resolving power, a correct exposure which is not affected by an irradiation atmosphere and a good storage stability.

Other objects and advantages of the present invention will be apparent from the following descriptions.

In accordance with the present invention, there is provided a negative type resist for deep ultraviolet light lithography comprising a polymer of a diallyl ester of a dicarboxylic acid having degree of dispersion of 3 or less, as defined by the ratio of a weight-average molecular weight $\overline{M}w$ to a number-average molecular weight $\overline{M}n$.

In accordance with the present invention, there is also provided a method for producing a resist pattern on a substrate comprising the steps of:

applying, to the substrate, a coating of resist comprising a polymer of a diallyl ester of a dicarboxylic acid having a degree of dispersion of 3 or less, irradiating the resist coating with deep ultraviolent light having a wavelength of from 180 to 350 nm in accordance with a desired pattern to be formed on the substrate, and developing the irradiated coating with a solvent so as to form the desired negative resist pattern on the substrate.

BRIEF DESCRIPTION OF THE DRAWINGS

The present invention now will be further illustrated by, but is by no means limited to, the following Examples and the accompanying drawings, in which FIG. 5 illustrates the correlation of the residual resist film thickness and exposure, of the poly [diallyl dicarboxylate] of the present invention.

DETAILED DISCLOSURE OF THE INVENTION

Figure 1:
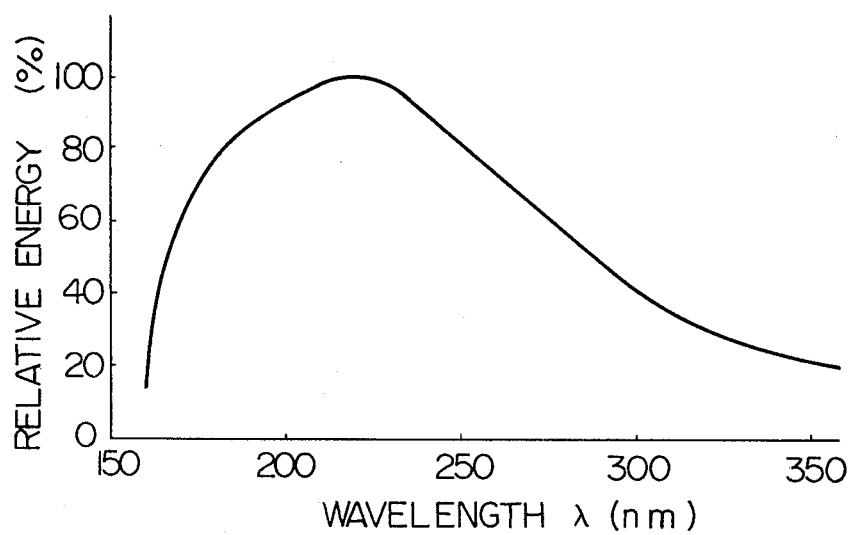
FIG. 1 illustrates the energy distribution curve of the deuterium spectral lamp used in the Examples.

The polymers of diallyl esters of dicarboxylic acids of the present invention include, for example, polymers of diallyl esters of aliphatic dicarboxylic acids having the general formula [I]

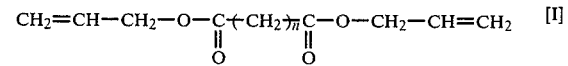

wherein n is zero or an integer from 1 to 8, polymers of diallyl esters of aromatic dicarboxylic acids having the general formula [II],

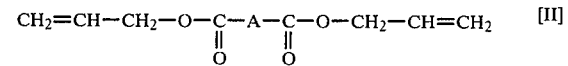

wherein A is a phenylene or naphthylene group, and other polymers derived from for example, diallyl carbonate, diallyl maleate and the like.

Typical examples of the diallyl dicarboxylates having the general formula [I] are diallyl oxalate, diallyl malonate, diallyl succinate, diallyl glutarate, diallyl adipate, diallyl sebacate and the like. Typical examples of the diallyl dicarboxylates having the general formula [II] are diallyl phthalate, diallyl isophthalate, diallyl terephthalate and the like.

Among these polymers, the polymers of the diallyl esters of aromatic dicarboxylic acids are the most preferable from a practical point of view. This is because the polymers having phenyl groups therein are generally heat-resistant.

The weight-average molecular weight ($\overline{M}w$) of the polymers of the present invention is generally within the range of from 2000 to 500,000 and, more preferably, within the range of from 5,000 to 100,000. It should be noted that, in order to obtain a negative type deep UV resist having a good resolving power, the degree of dispersion, which is defined by a ratio of a weight-average molecular weight ($\overline{Mw}$) to a number-average molecular weight ($\overline{Mn}$) (i.e. $\overline{Mw}/\overline{Mn}$), is generally 3 or less and, more preferably within the range of from 1.0 to 3.0.

The polymers of diallyl esters of dicarboxylic acids of the present invention can be prepared according to any conventional technique such as a radical polymerization. For instance, poly (diallyl phthalate) can be prepared as follows.

0.2 part by weight of benzoyl peroxide is added to 100 parts by weight of diallyl phthalate and the mixture is heated to a temperature of 60° C. The polymerization is stopped before gel is formed. The polymer solution thus obtained is then introduced into methanol, whereby the polymer is separated from the monomer. The yield of the polymer is less than 25%.

The polymer thus separated is then dissolved in methyl ethyl ketone (MEK) to prepare a 5% by weight solution. A proper amount of isopropyl alcohol (IPA) is added to this solution, whereby several polymer fractions are precipitated. The molecular weight and the degree of dispersion can be adjusted by the additional amount of IPA. The polymer contained in the first fraction which is precipitated by the first addition of IPA is not used in this invention. This is because, since the first fraction contains giant molecules and therefore the degree of dispersion is large, a fine detail resist pattern having a high resolution cannot be obtained.

In the case where the diallyl esters of dicarboxylic acids are polymerized, some of the allyl groups contained in the diallyl esters of dicarboxylic acids form rings in the molecule during the polymerization step. Thus, the content of the allyl group (i.e. allyl content) in the polymers decreases compared to the allyl content in the starting monomers. However, it should be noted that the preferable allyl content in the polymer of the present invention is within the range of from 30 to 95% based on the initial total allyl content present in the starting monomer (i.e. based on the theoretical amount).

In accordance with the present invention, a negative type fine detail resist pattern may be produced on a substrate, such as of Si, $SiO_2$ and $Si_3N_4$ substrate, as follows.

A resist solution containing the above mentioned polymer is first applied onto a substrate in a general manner (e.g. a spin coating) to form a resist coating or film on the substrate. The spun film is then heated for about 15 to 60 min. at a temperature of about 60° to 80° C. under, for example, a nitrogen atmosphere.

The film thus formed is then irradiated with deep UV light having a wavelength of from 180 to 350 nm in accordance with a desired pattern. The light source used in the present invention can be, for example, deuterium spectral lamps, Xe-Hg arc lamps and the like. This irradiation causes the cross-linking of the polymer film. Therefore, the irradiated portion of the film (i.e. cross-linked film) becomes insoluble in the solvents, whereas the non-irradiated portion of the film is more easily soluble in the solvents than the irradiated portion of the film. The irradiated film is then developed with any suitable solvent such as, for example, methyl isobutyl ketone, a mixture of chlorobenzene and isoamyl acetate (1:05 to 1:4), a mixture of toluene and ethylene glycol monoethyl ether (1:1 to 1:3) and the like. The developed negative type resist film pattern has the following advantages.

(1) Since the pattern is highly cross-linked, it is more resistant to thermal deformation than those derived from the conventional deep UV resists.

(2) Since the resolving power of the resist is very high, a pattern having a feature size of 1 micron or less can be obtained.

(3) The pattern thus obtained has a high dry etching resistance.

EXAMPLE 1

Resist solutions were prepared by dissolving the polymers of diallyl phthalate (which are hereinafter called the "DAP") and the polymer of diallyl isophthalate (which is hereinafter called the "DAI"), both listed in Table 1 below, in 2-ethoxyethyl acetate. The concentration of the polymer in each resist solution was 20% by weight and the allyl content in each polymer was approximately 60% based on the theoretical value.

Each resist solution thus obtained was spin-coated on an Si substrate having a 0.5 micron thick heat-oxidized $SiO_2$ film thereon. The dry thickness of the resist film was 0.5 micron. The coated resist film was then heated, under a nitrogen atmosphere, for 30 minutes at a temperature of 80° C. The resist film thus obtained was then irradiated with a 200 W deuterium spectral lamp by using an appropriate mask. The energy distribution curve of the deuterium spectral lamp is illustrated in FIG. 1, wherein the energy of this lamp is clearly centered or concentrated at a deep UV region (i.e. within a wavelength range of from 180 to 350 nm).

The irradiated resist film was then developed in a mixture of monochlorobenzene and isoamyl acetate under the conditions shown in Table 1 below, whereby the non-irradiated portions were washed off.

Figure 2:
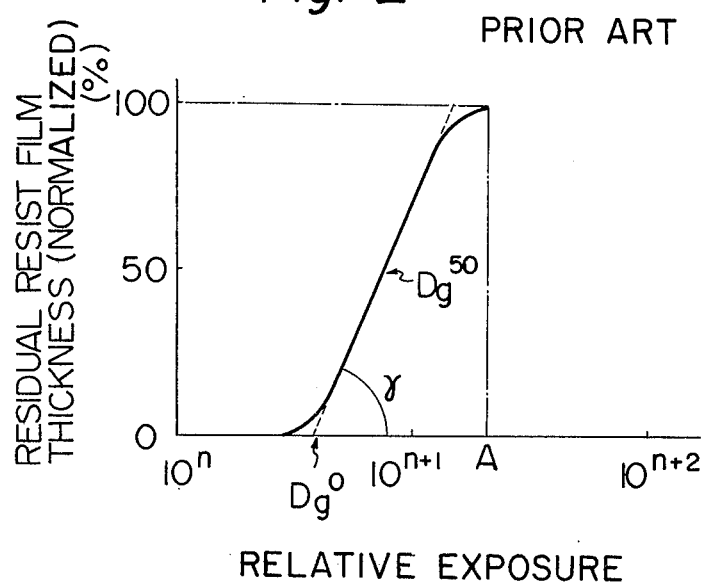
FIG. 2 illustrates the correlation of the residual resist film thickness and exposure, of a conventional resist.

FIG. 2 illustrates the correlation of the residual resist film thickness and the exposure of a conventional resist PMMA (poly(methyl methacrylate)) listed in Table 1 below. The sensitivity of the resist is defined as an exposure A when the residual resist film thickness becomes 100% after the development. The sensitivity of the present resist is relatively determined based on the exposure value of PMMA, assuming that the exposure value of PMMA is 1.0 when the residual thickness of the resist film having a thickness of 0.5 micron becomes zero under the development conditions shown in Table 1 below. The results are shown in Table 1.

The molecular weights of the resists in Table 1 were calculated from the molecular-weight distribution curves of the resists using a calibration curve of standard polystyrenes. The molecular-weight distribution curves were obtained by using high-speed liquid chromatography.

TABLE 1

| Resist | $\overline{Mw}$ | $\overline{Mn}$ | $\overline{Mw}/\overline{Mn}$ | Development Conditions Solvent | Time (sec) | Temperature (°C.) | Sensitivity (Relative Exposure) |
|---|---|---|---|---|---|---|---|
| PMMA | $3.05 \times 10^5$ | $1.88 \times 10^5$ | 1.62 | MIBK/IPA = ⅓ (V/V) | 60 | 20 | 1.0 |
| DAP-1 | $1.11 \times 10^4$ | $7.15 \times 10^3$ | 1.55 | MCB/IAA = | 50 | 20 | 0.096 |

TABLE 1-continued

| Resist | $\overline{M}w$ | $\overline{M}n$ | $\overline{M}w/\overline{M}n$ | Solvent | Development Conditions Time (sec) | Temperature (°C.) | Sensitivity (Relative Exposure) |
| --- | --- | --- | --- | --- | --- | --- | --- |
| DAP-2 | $2.67 \times 10^4$ | $1.55 \times 10^4$ | 1.72 | 1/2.5(V/V) MCB/IAA = ⅓ (V/V) | 60 | 20 | 0.047 |
| DAP-3 | $3.88 \times 10^4$ | $1.69 \times 10^4$ | 2.30 | " | | | 0.036 |
| DAP-4 | $1.47 \times 10^5$ | $5.66 \times 10^4$ | 2.60 | " | | | 0.013 |
| DAI-1 | $1.10 \times 10^5$ | $6.1 \times 10^4$ | 1.80 | " | | | 0.016 |

Remarks
MIBK: Methyl isobutyl ketone
IPA: Isopropyl alcohol
MCB: Monochlorobenzene
IAA: Isoamyl acetate As is clear from the results shown in Table 1, although the sensitivity of the deep UV resist of the present invention varies depending upon the degree of molecular weight dispersion, thereof, the sensitivity of the present resist is much better than that of the conventional resist.

Figure 3:
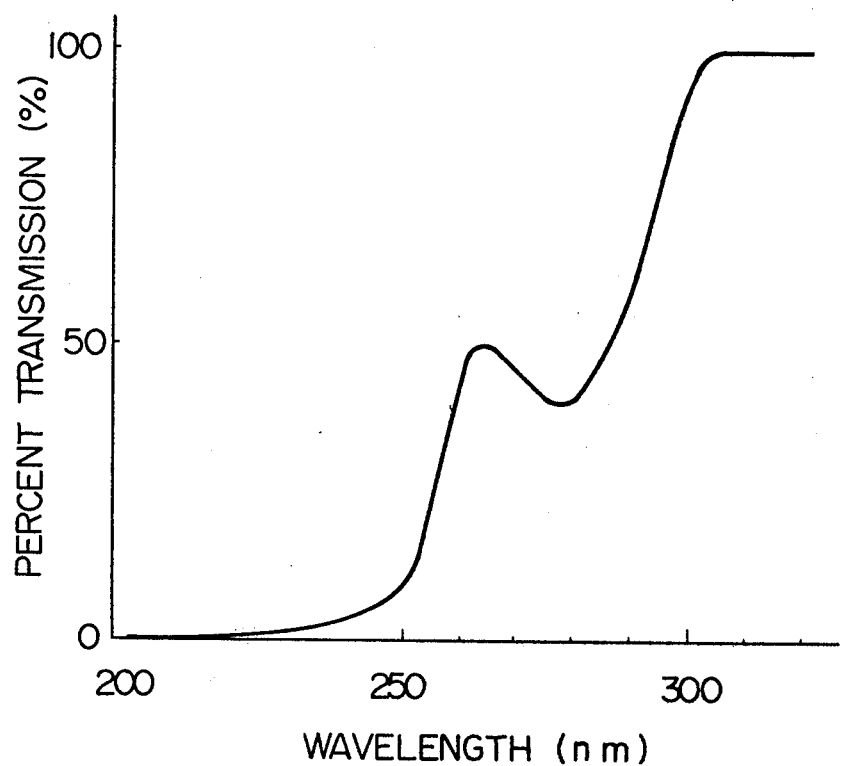
FIG. 3 illustrates the spectral transmission of the resist DAP-1 used in Example 1.

FIG. 3 illustrates the spectral transmission of the present resist DAP-1 when the sample was irradiated with the deuterium spectral lamp used in this Example. The curve in FIG. 3 clearly shows that the sample DAP-1 especially absorbs an ultraviolet light ranging from 250 nm to 305 nm. This means that the resist DAP-1 is well sensitized in this region. The other resists of the present invention shown in Table 1 (i.e. DAP-2 through DAP-4 and DAI-1) exhibited similar results.

EXAMPLE 2

In FIG. 2, the contrast γ is defined as follows:

$$\gamma = \frac{0.5}{\log \frac{Dg^{50}}{Dg^0}} \quad (1)$$

wherein $Dg^{50}$ represents the exposure (J/cm²) when the residual resist thickness is 50% of the initial thickness in the residual resist thickness curve, and $Dg^0$ represents the exposure (J/cm²) at 0% of the normalized residual resist thickness when the straight portion of the residual resist thickness curve is extrapolated.

The contrast γ is approximately the slope of the tangent at 50% of the normalized residual resist thickness curve in FIG. 2. In order to obtain a pattern having a limiting width (or a feature size) of 2 microns or less, the contrast γ should be at least 1.0. When the contrast γ is less than 1.0, the portion of the resist which is not to be irradiated with deep UV light is unpreferably irradiated due to the diffraction of the deep UV light at the edge portion of the mask.

Figure 4:
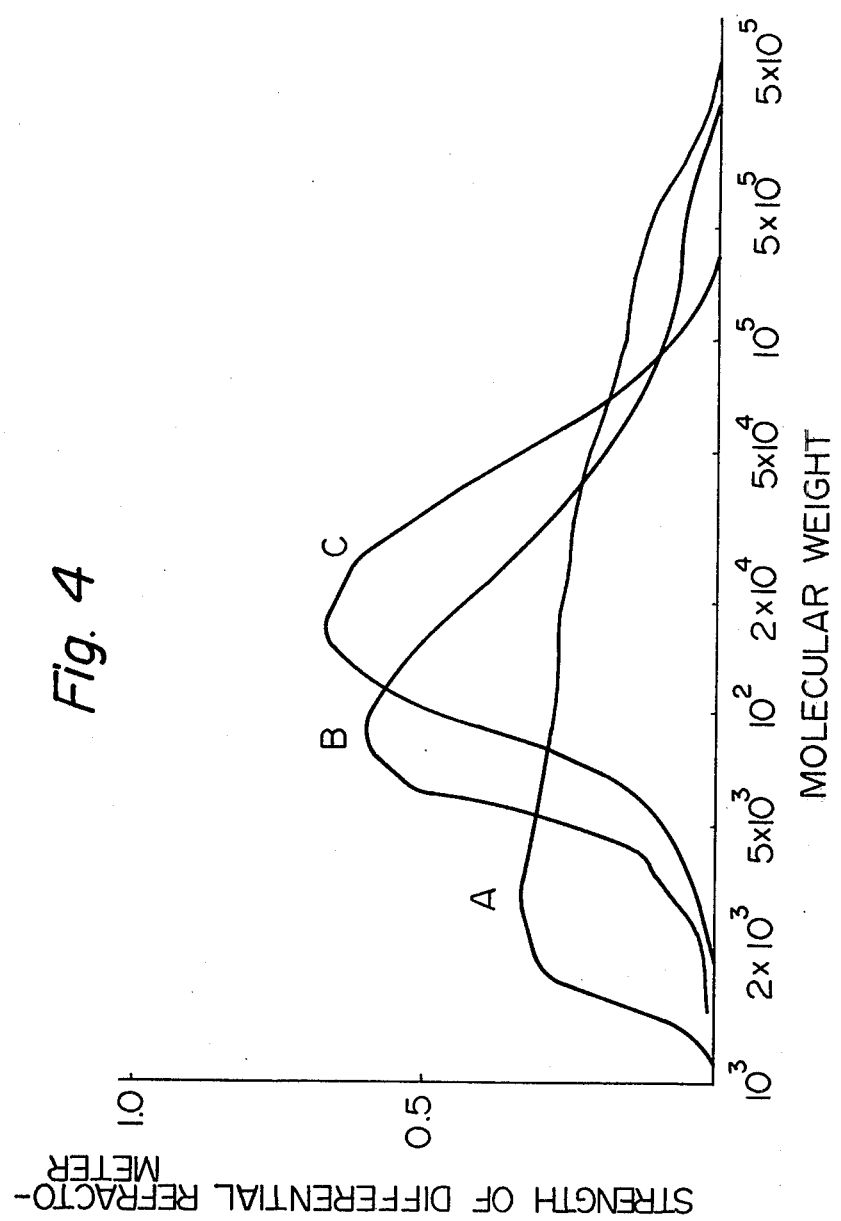
FIG. 4 illustrates molecular-weight distribution curves of the resists used in the Examples.

FIG. 4 illustrates molecular-weight distribution curves of the resists of the present invention. In FIG. 4, curve A shows the molecular-weight distribution curve of a 20% by weight resist solution of poly (diallyl phthalate) (which is hereinafter called the "DAP-5" for brevity's sake) in 2-ethoxyethyl acetate. The average molecular-weights $\overline{M}n$ and $\overline{M}w$ of DAP-5 were $6.67 \times 10^3$ and $4.23 \times 10^4$, respectively. Thus, the degree of molecular-weight dispersion $\overline{M}w/\overline{M}n$ was 6.34. Curve B shows the molecular-weight distribution curve of a resist, poly (diallyl phthalate) (i.e. DAP-6) having an $\overline{M}n$ of $1.14 \times 10^4$, a $\overline{M}w$ of $2.94 \times 10^4$ and a ratio $\overline{M}w/\overline{M}n$ of 2.58. Curve C shows the molecular-weight distribution curve of DAP-2 used in Example 1 above.

FIG. 5 illustrates the residual resist thickness curves of DAP-2, DAP-5, and DAP-6. The abscissa of the graph in FIG. 5 represents the relative exposure when the sensitivity of the PMMA is 1.0. Curves A, B and C in FIG. 5 correspond to those shown in FIG. 4, respectively.

From the comparison of the curves shown in FIGS. 4 and 5, it can be understood that the larger the degree of the dispersion $\overline{M}w/\overline{M}n$, the poorer is the above-mentioned contrast γ. In addition, since the contrast γ of the sample DAP-6, of which the degree of dispersion, $\overline{M}w/\overline{M}n$ is near 3, is 1.26, it is clearly understood that the polymers of the diallyl dicarboxylates having the degree of dispersion $\overline{M}w/\overline{M}n$ of 3 or less are suitable for use, as a resist, in deep UV lithography from the point of view of the contrast γ.

The contrast γ of the sample DAP-5 having a degree of dispersion of 6.34 was 0.79 and that of the sample DAP-2 having a degree of dispersion of 1.72 was 2.84.

The residual resist thickness of FIG. 5 was determined using the resist film which was prepared on an Si substrate in a manner as described in Example 1. The resist film was irradiated with the deuterium spectral lamp using a hard-contacted chrome mask on synthetic quartz having a thickness of 0.06 inch. The determination was made with respect to a line pattern having a width of 1.0 micron.

EXAMPLE 3

Various developing liquids for developing the polymers of the diallyl dicarboxylates were evaluated.

Latent resist patterns having a width of 0.5 micron were prepared by irradiating resist films prepared from the resists DAP-1 to DAP-4 and DAI-1 used in Example 1 in a manner as described in Example 1. These latent resist patterns were developed with various solvents shown in Table 2 below at a liquid temperature of 20° C. for approximately 1 minute. The results are shown in Table 2.

TABLE 2

| No. | Solvent | Result |
| --- | --- | --- |
| 1. | A mixture of methyl isobutyl ketone and methyl ethyl ketone | Solvent cracks |
| 2. | 1,2-Dichloroethane | Solvent cracks |
| 3. | Monochlorobenzene | Solvent cracks |
| 4. | Dioxane | Solvent cracks |
| 5. | Cyclohexanone | Solvent cracks |
| 6. | n-Propyl acetate | Solvent cracks |
| 7. | A mixture of methyl ethyl ketone and isopropyl alcohol | Solvent cracks |
| 8. | A mixture of methyl ethyl ketone and ethyl alcohol | Whitening |
| 9. | Methyl isobutyl ketone | Good |
| 10. | A mixture of monochlorobenzene and isoamyl acetate | Good |

As is clear from the results shown in Table 2, solvents No. 9 and No. 10 are suitable for use in the development of the present deep UV resists.

EXAMPLE 4

The dry-etching resistance of the resist DAP-1 used in Example 1 was evaluated by using gaseous $CF_4$. The etching was conducted by using a plasma etching apparatus under the conditions of a radiofrequency wave of 13.56 MHz, an applied electric power of 150 W and a $CF_4$ gas pressure of 0.06 Torr. The relative etching rates of DAP-1 and other materials as compared to the etching rate of AZ-1350J (Photoresist available from Shipley Co.) is shown in Table 3 below.

TABLE 3

| Material | Relative Etching Rate |
|---|---|
| AZ-1350J | 1.0 |
| PMMA | 2-3 |
| Silicone | 4-6 |
| $SiO_2$(heat oxidized) | 0.7 |
| DAP-1 | 1.1-1.4 |

As is clear from the results shown in Table 3, the dry etching resistance of DAP-1 is as good as that of AZ-1350J and is better than that of PMMA. The dry etching resistances of the other resists of the present invention used in Example 1 were similar to that of DAP-1.

As mentioned hereinabove according to the present invention, fine detail resist patterns having a high resolution (i.e. a high contrast $\gamma$) and a high sensitivity can be obtained by irradiating the polymers of the diallyl dicarbonate with deep UV light followed by the development.

What is claimed is:

1. A negative type resist for deep ultraviolet light lithography derived from a polymer selected from the group consisting of (i) diallyl esters of aliphatic dicarboxylic acids having the general formula

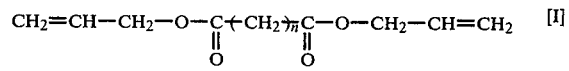

where n is zero or an integer from 1 to 8, and (ii) diallyl esters of aromatic dicarboxylic acids having the general formula

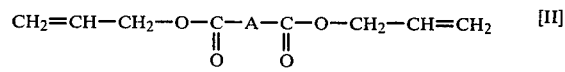

where A is a phenylene or a naphthylene group, the degree of dispersion of said polymer within the range from 1 to 3.

2. The resist of claim 1 having a contrast of at least approximately 1.0.

3. The resist of claim 1, said polymer being derived from diallyl carbonate or diallyl maleate.

4. The resist of claim 1, said ester of said acid comprising a diallyl dicarboxylate.

5. The resist of claim 1, said diallyl ester of an aliphatic dicarboxylic acid being diallyl oxalate, diallyl malonate, diallyl succinate, diallyl glutarate, diallyl adipate or diallyl sebacate.

6. The resist of claim 1, said diallyl ester of an aromatic dicarboxylic acid comprising diallyl pthalate, diallyl isophthalate or diallyl terephthalate.

7. The resist of claim 1, said polymer comprising a weight-average molecular weight within the range from 2000 to 500,000.

8. The resist of claim 1, said polymer comprising a weight-average molecular weight within the range from 5,000 to 100,000.

9. The resist of claim 1, said polymer comprising a heat resistant phenyl group.

10. A method for producing a resist pattern on a substrate comprising the steps of:
applying, to the substrate, a coating of a resist derived from a polymer of a diallyl ester of a dicarboxylic acid having a degree of dispersion within the range of from 1 to 3, said polymer being selected from the group consisting of
(i) diallyl esters of aliphatic dicarboxylic acids having the general formula

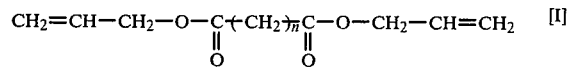

where n is zero or an integer from 1 to 8, and
(ii) diallyl esters of aromatic dicarboxylic acids having the general formula

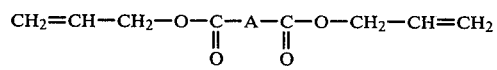

where A is a phenylene or a naphthylene group,
irradiating the resist coating with deep ultraviolet light having a wavelength of from 180 to 350 nm in accordance with a desired pattern to be formed on the substrate, and
developing the irradiated coating with a solvent so as to form the desired negative resist pattern on the substrate.

11. the method of claim 10, wherein said solvent is methyl isobutyl ketone or a mixture of monochlorobenzene and isoamyl acetate.

12. The method of claim 10 comprising forming said resist pattern to have a minimum feature size as small as approximately 2 microns.

* * * * *

UNITED STATES PATENT AND TRADEMARK OFFICE
CERTIFICATE OF CORRECTION

PATENT NO. : 4,267,258
DATED : May 12, 1981
INVENTOR(S) : Yoneda et al.

It is certified that error appears in the above—identified patent and that said Letters Patent is hereby corrected as shown below:

Front Page, [75] Inventors, "Yamanishi" should be --Naka--;
  *[73] Assignee, "Tokyo" should be -- Kanagawa --.
  [57] Abstract, line 7, "Mn" should be --$\overline{Mn}$--.
*Column 1, line 16, "is" should be --has been--;
  *line 33, delete "able to be".
*Column 2, line 9, "ultraviolent" should be --ultraviolet--;
  *line 24, "exposure," should be --exposure--;
  *line 45, delete ",";
  line 51, "or" should be --or a--;
  *line 52, "from" should be --from,--.
*Column 3, line 7, "and," should be --and--;
  line 45, "substrate, as" should be --, as--;
  *line 47, "above mentioned" should be --above-mentioned--;
  line 52, "C." should be --C--.
Column 4, line 5, "(1:05" should be --(1:0.5--;
  in the seventh column of Table I, "(°C.)" should be --(°C)--.
Column 5, in the seventh column of Table I, "(°C.)" should be --(°C)--;
  *line 17, "dispersion," should be --dispersion--.

UNITED STATES PATENT AND TRADEMARK OFFICE
CERTIFICATE OF CORRECTION

PATENT NO. : 4,267,258
DATED : May 12, 1981
INVENTOR(S) : Yoneda et al.

It is certified that error appears in the above—identified patent and that said Letters Patent is hereby corrected as shown below:

*Column 6, line 24, "dispersion," should be --dispersion--;
    *line 26, at the beginning of the line insert --when--;
    line 51, "C." should be --C--.
Column 7, line 45, "$CH_2=CH-CH_2-O-\underset{O}{C}-$ ..." should be --$CH_2=CH-CH_2-O-\underset{O}{C}-$... --.
*Column 8, line 12, "pthalate" should be --phthalate--;
    line 33, "$CH_2=CH-CH_2-O-\underset{O}{C}-$ ..." should be --$CH_2=CH-CH_2-O-\underset{O}{C}-$ ... --.

Signed and Sealed this

Thirteenth Day of October 1981

[SEAL]

Attest:

Attesting Officer

GERALD J. MOSSINGHOFF
Commissioner of Patents and Trademarks